United States Patent
Chern (10) Patent No.: US 11,545,617 B2
(45) Date of Patent: Jan. 3, 2023

(54) METHOD OF FABRICATING MAGNETIC MEMORY DEVICE

(71) Applicant: HeFeChip Corporation Limited, Sai Ying Pun (HK)

(72) Inventor: Geeng-Chuan Chern, Cupertino, CA (US)

(73) Assignee: HeFeChip Corporation Limited, Sai Ying Pun (HK)

( * ) Notice: Subject to any disclaimer, the term of this patent is extended or adjusted under 35 U.S.C. 154(b) by 0 days.

(21) Appl. No.: 17/489,822

(22) Filed: Sep. 30, 2021

(65) Prior Publication Data

US 2022/0020918 A1 Jan. 20, 2022

Related U.S. Application Data

(63) Continuation of application No. 16/701,066, filed on Dec. 2, 2019, now Pat. No. 11,177,431.

(51) Int. Cl.
| | |
|---|---|
| *H01L 43/02* | (2006.01) |
| *G11C 11/16* | (2006.01) |
| *H01L 43/10* | (2006.01) |
| *H01F 10/32* | (2006.01) |
| *H01L 27/22* | (2006.01) |
| *H01L 43/12* | (2006.01) |
| *H01F 41/34* | (2006.01) |

(52) U.S. Cl.
CPC ............ *H01L 43/02* (2013.01); *G11C 11/161* (2013.01); *H01F 10/329* (2013.01); *H01F 10/3259* (2013.01); *H01F 41/34* (2013.01); *H01L 27/228* (2013.01); *H01L 43/10* (2013.01); *H01L 43/12* (2013.01)

(58) Field of Classification Search
CPC ......... H01L 43/02; H01L 43/08; H01L 43/10; H01L 43/12; H01L 27/228; G11C 11/14–16; G11C 11/161; H01F 41/34; H01F 10/3259

See application file for complete search history.

(56) References Cited

U.S. PATENT DOCUMENTS

| | | |
|---|---|---|
| 6,048,775 A | 4/2000 | Yao |
| 6,808,748 B2 | 10/2004 | Kapoor |
| 7,223,701 B2 | 5/2007 | Min |
| 7,936,027 B2 | 5/2011 | Xiao |
| 8,456,893 B2 | 6/2013 | Horng |
| 8,536,063 B2 | 9/2013 | Satoh |
| 9,755,140 B2 | 9/2017 | Lim |
| 9,806,252 B2 | 10/2017 | Tan |
| 9,899,594 B2 | 2/2018 | Kim |
| 2018/0130943 A1 | 5/2018 | Naik |

*Primary Examiner* — Allison Bernstein
(74) *Attorney, Agent, or Firm* — Winston Hsu (57) ABSTRACT

A method for forming a magnetic memory device is disclosed. At least one magnetic tunneling junction (MTJ) stack is formed on the substrate. The MTJ stack comprises a reference layer, a tunnel barrier layer and a free layer. A top electrode layer is formed on the MTJ stack. A patterned sacrificial layer is formed on the top electrode layer. The MTJ stack is then subjected to a MTJ patterning process in a high-density plasma chemical vapor deposition (HDPCVD) chamber, thereby sputtering off the MTJ stack not covered by the patterned sacrificial layer. During the MTJ patterning process, sidewalls of layers or sub-layers of the MTJ stack are simultaneously passivated in the HDPCVD chamber by depositing a sidewall protection layer.

5 Claims, 5 Drawing Sheets

METHOD OF FABRICATING MAGNETIC MEMORY DEVICE

CROSS REFERENCE TO RELATED APPLICATIONS

This is a continuation of U.S. application Ser. No. 16/701,066 filed on Dec. 2, 2019, the disclosure of which is included in its entirety herein by reference.

BACKGROUND OF THE INVENTION

1. Field of the Invention

The present disclosure relates to a magnetic memory device, and more particularly, to a method of fabricating a magnetic tunnel junction (MTJ) element with sidewall protection for magnetic memory devices, and a method for manufacturing the same.

2. Description of the Prior Art

Magnetoresistive random access memory (MRAM), based on the integration of silicon CMOS with MTJ technology, is a major emerging technology that is highly competitive with existing semiconductor memories such as SRAM, DRAM, Flash, etc., and has the potential of becoming universal memories. Spin Transfer Torque (STT) MRAM is especially popular due to its smaller cell size.

The MTJ stack of STT MRAM usually contains about 20-30 layers of different materials with thickness ranging from a few tenths of nm to a few nm. It is very difficult to pattern these materials by the conventional plasma etch chemistries because of the non-volatile by-products. Thus, the non-reactive Ion Beam Etch (IBE) methods utilizing inert gas ions, such as argon (Ar) ions, are typically implemented to sputter off the materials in the unwanted areas.

However, the IBE methods suffer from leakage or short issues due to re-deposition of the sputtered off materials on the MTJ sidewalls. Some prior arts have added organic chemicals, such as CO, $CH_3OH$, etc. to argon (Ar) plasma so that the etched by-products become organometallic complexes, which are relatively more volatile and can be easily pumped out of the etching chamber. However, this approach tends to slow down the etch rate, and the residual organometallic complexes might have impact on the MTJ long term reliability.

Some other methods, using several different machines, include the following steps:
1. Partially etch the MTJ stack, mostly up to the layer on top of the tunneling dielectric layer, e.g. MgO.
2. Deposit an insulator layer.
3. Anisotropic etch the insulator layer to form sidewall protection.
4. Deliver the wafer back to the IBE tool for further etch.

However, the above-mentioned prior art is complex and requires different machines or tools and cannot prevent leakage or short between each two adjacent sublayers. While leakage or short between two adjacent sublayers might not be fatal, it does degrade MTJ performance and could increase write and/or read error rates. Some prior arts involve combination of Atomic Layer Deposition (ALD) and Atomic Layer Etch (ALE) together with sidewall protection. All these, require multiple machines, and might require development of new machines, which are time-consuming and expensive processes.

SUMMARY OF THE INVENTION

It is one object of the present disclosure to provide a method of fabricating an improved magnetic tunnel junction (MTJ) element with sidewall protection for a magnetic memory device, which is capable of solving the above-mentioned prior art shortcomings or problems.

One aspect of the invention provides a method for forming a magnetic memory device is provided. First, a substrate is provided. At least a magnetic tunneling junction (MTJ) stack is formed on the substrate. The MTJ stack comprises a reference layer, a tunnel barrier layer, and a free layer. A top electrode layer is formed on the MTJ stack. A patterned sacrificial layer is formed on the top electrode layer. The MTJ stack is then subjected to a MTJ patterning process in a high-density plasma chemical vapor deposition (HDPCVD) chamber, thereby sputtering off the MTJ stack not covered by the patterned sacrificial layer. During the MTJ patterning process, sidewalls of layers or sub-layers of the MTJ stack are in-situ passivated in the HDPCVD chamber by depositing a non-conformal sidewall protection layer. A thickness of the non-conformal sidewall protection layer decreases from top to bottom.

According to some embodiments, the MTJ stack is etched in the high-density plasma chemical vapor deposition (HDPCVD) chamber with a deposition to sputtering ratio ranging between about 0.1-0.5.

According to some embodiments, the sidewall protection layer comprises silicon nitride.

According to some embodiments, the sidewall protection layer comprises silicon oxide.

According to some embodiments, the method further comprises: depositing a HDPCVD dielectric layer covering the non-conformal sidewall protection layer in the HDPCVD chamber with a deposition to sputtering ratio ranging between about 2-10.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

It should be noted that all the figures are diagrammatic. Relative dimensions and proportions of parts of the drawings are exaggerated or reduced in size, for the sake of clarity and convenience. The same reference signs are generally used to refer to corresponding or similar features in modified and different embodiments.

DETAILED DESCRIPTION

Advantages and features of embodiments may be understood more readily by reference to the following detailed description of preferred embodiments and the accompanying drawings. Embodiments may, however, be embodied in many different forms and should not be construed as being limited to those set forth herein. Rather, these embodiments are provided so that this disclosure will be thorough and complete and will fully convey exemplary implementations of embodiments to those skilled in the art, so embodiments will only be defined by the appended claims. Like reference numerals refer to like elements throughout the specification.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of the embodiments.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

With regard to the fabrication of transistors and integrated circuits, the term "major surface" refers to that surface of the semiconductor layer in and about which a plurality of transistors are fabricated, e.g., in a planar process. As used herein, the term "vertical" means substantially orthogonal with respect to the major surface. Typically, the major surface is along a <100> plane of a monocrystalline silicon layer on which the field-effect transistor devices are fabricated. The term "horizontal" as used herein is defined as a plane parallel to the conventional major plane or surface of the semiconductor substrate, regardless of its orientation. Terms, such as "on", "above", "below", "bottom", "top", "side" (as in "sidewall"), "higher", "lower", "over", and "under", are defined with respect to the horizontal plane.

The present disclosure pertains to an improved magnetic tunneling junction (MTJ) element of a magnetoresistive random access memory (MRAM) device such as a spin-transfer torque magnetoresistive random access memory (STT-MRAM) device. STT-MRAM is a non-volatile memory, which has several advantages over the conventional magnetoresistive random access memory. For example, these advantages include higher scalability, lower-power consumption, and faster operating speed. Spin transfer torque is an effect in which the magnetization orientation of a magnetic layer in a magnetic tunnel junction or spin valve can be modified using a spin-polarized current. STT-MRAM uses electrons that become spin-polarized as the electrons pass through a thin film (spin filter). During a write operation, the spin-polarized electrons exert torque on a free layer, which switches a polarity of the free layer. During a read operation, a current detects the resistance/logic state of the MTJ storage element.

A MRAM device is generally comprised of an array of parallel first conductive lines such as word lines on a horizontal plane, an array of parallel second conductive lines such as bit lines on a second horizontal plane spaced above and formed in a direction perpendicular to the first conductive lines, and a MTJ element interposed between a first conductive line and a second conductive line at each crossover location. Typically, access transistors may be disposed below the array of first conductive lines to select certain MRAM cells within the MRAM array for read or write operations.

A MTJ element may be based on a tunnel magneto-resistance (TMR) effect wherein a stack of layers has a configuration in which two ferromagnetic layers are separated by a thin non-magnetic dielectric layer or tunnel barrier layer. If the tunnel barrier layer is thin enough, electrons can tunnel from one ferromagnet into the other. In a MRAM device, the MTJ element is typically formed between a bottom electrode layer and a top electrode layer. A MTJ stack of layers that is subsequently patterned to form a MTJ element may be formed by sequentially depositing a seed layer, an anti-ferromagnetic (AFM) pinning layer, a ferromagnetic "pinned" layer, a thin tunnel barrier layer, a ferromagnetic "free" layer, and a capping layer. The AFM layer holds the magnetic moment of the pinned layer in a fixed direction.

As previously mentioned, one of the major challenges facing STT-MRAM involves the patterning of the MTJ stack in a dense array. Electrically conductive non-volatile by-products condense on the sidewall of the MTJ stack and electrically shunt the magnetic tunnel junction. The present invention addresses this issue.

According to some embodiments, the MTJ stack is patterned only by a high-density plasma chemical vapor deposition (HDPCVD) tool, instead of using the conventional ion-beam etching (IBE) tools or combinations of multiple tools. When patterning the MTJ stack in the HDPCVD chamber, the MTJ stack is etched and the sloped sidewall surface of the MTJ stack is concurrently passivated during etching, which inhibits or prevents accumulation of conducting residue directly on the sidewall of the MTJ stack to avoid shorting. Therefore, the yield and throughput of the manufacturing process of the MRAM devices can be improved and the cost can be reduced.

Figure 1:
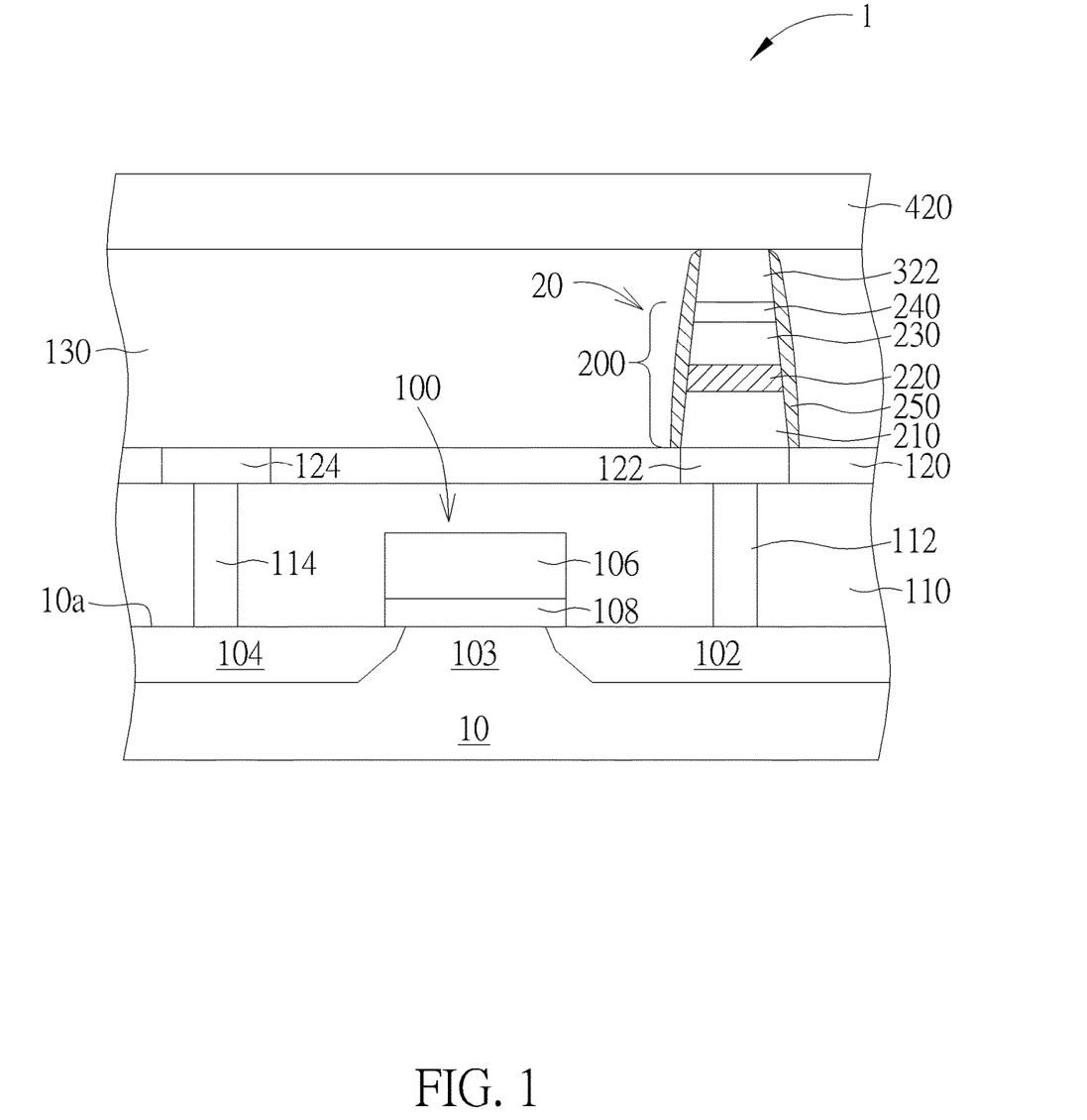
FIG. 1 is a schematic, cross-sectional diagram showing an exemplary one-transistor-one-MTJ (1T1MTJ) structure of a MRAM device according to a non-limiting embodiment of the present invention.

FIG. 1 is a schematic, cross-sectional diagram showing an exemplary one-transistor-one-MTJ (1T1MTJ) structure of a MRAM device 1 according to a non-limiting embodiment of the present invention. As shown in FIG. 1, the MRAM device 1 comprises a substrate 10 having a top surface 10a. For example, the substrate 10 may be a silicon substrate, a silicon-on-insulator (SOI) substrate, or any suitable semiconductor substrates known in the art.

According to one embodiment, an access transistor 100 may be formed on the top surface 10a of the substrate 10. The access transistor 100 may comprise a drain doping region 102 and a source doping region 104 spaced apart from the drain doping region 104. The drain doping region 102 and the source doping region 104 may be formed by ion implantation process and may be formed in the substrate 10. A channel region 103 may be formed between the drain doping region 102 and the source doping region 104. A gate 106 may be formed over the channel region 103. A gate dielectric layer 108 such as a silicon oxide layer may be formed between the gate 106 and the channel region 103.

It is to be understood that the MRAM device 1 may comprise peripheral circuits for supporting the MRAM memory array. The peripheral circuits may be formed in a logic circuit area, which is not shown for the sake of simplicity.

An inter-layer dielectric (ILD) layer 110 such as an oxide layer or an ultra-low k (ULK) dielectric layer may be deposited over the substrate 10. The ILD layer 110 covers the gate 106, the drain doping region 102, and the source doping region 104 of the transistor 100. A contact plug 112 and a contact plug 114 may be formed directly on the drain doping region 102 and the source doping region 104, respectively, in the ILD layer 110. For example, the contact plug 112 and the contact plug 114 may comprise Cu, Ti, TiN, Ta, TaN, W, alloys or combinations thereof, but is not limited thereto. An ILD layer 120 and an ILD layer 130 may be deposited over the ILD layer 110. For example, the ILD layer 120 may comprise an oxide layer or an ULK dielectric layer, but not limited thereto. For example, the ILD layer 130 may comprise an oxide layer such as a high-density plasma (HDP) CVD oxide layer, but not limited thereto.

According to one embodiment, a memory stack 20 may be formed on the contact plug 112 in the ILD layer 130. The memory stack 20 may comprise a magnetic tunneling junction (MTJ) element (or MTJ stack) 200 sandwiched by a bottom electrode layer 122 and a top electrode layer 322. The bottom electrode layer 122 may be disposed in the ILD layer 120. The MTJ element 200 is electrically coupled to the drain doping region 102 through the bottom electrode layer 122 and the contact plug 112. For example, the bottom electrode layer 122 may comprise NiCr, Ru, Pt, Cu, Ta, TaN, Ti, TiN, or any combinations thereof.

According to one embodiment, the MTJ element 200 may comprise layered structure generally including, but not limited to, a reference layer (or pinned layer) 210, a tunnel barrier layer 220 stacked directly on the reference layer 210, and a free layer 230 stacked directly on the tunnel barrier layer 220. According to one embodiment, the reference layer 210 may comprise a pinned layer, an anti-ferromagnetic (AFM) layer, and/or a polarization enhancement layer (PEL), but not limited thereto.

For example, the reference layer 210 may be formed of a magnetic material comprising Co and Fe, including but not limited to CoFeB, CoFeBTi, CoFeBZr, CoFeBHf, CoFeBV, CoFeBTa, CoFeBCr, CoFeNi, CoFeTi, CoFeZr, CoFeHf, CoFeV, CoFeNb, CoFeTa, CoFeCr, CoFeMo, CoFeW, CoFeAl, CoFeSi, CoFeGe, CoFeP, or any combinations thereof. Moreover, the reference layer 210 may also have a magnetic structure comprising repeated alternating layers of two or more materials, such as but not limited to $(Co/Pt)_n$, $(Co/Pd)_n$, $(Co/Ni)_n$, $(CoFe/Pt)_n$, $(Co/Pt(Pd))_n$, or any combinations thereof. Alternatively, the reference layer 210 may be formed of a magnetic material comprising Co and Cr, including but not limited to CoCr, CoCrB, CoCrPt, CoCrPtB, CoCrPd, CoCrTi, CoCrZr, CoCrHf, CoCrV, CoCrNb, CoCrTa, or any combinations thereof. The reference layer 210 may have a magnetic super lattice structure.

According to one embodiment, the tunnel barrier layer 220 may comprise an insulator, including but not limited to MgO, $Al_2O_3$, MgAlO, MgZnO, HfO, or any combinations thereof. According to one embodiment, the tunnel barrier layer 220 may have a thickness of about 0.5 nm-3.0 nm.

According to one embodiment, the free layer 230 may comprise ferromagnetic materials. For example, the free layer 230 may be a single layer or multi-layer structure. For example, the free layer 230 may comprise Fe, Co, B, Ni, or any combinations thereof. For example, the free layer 230 may be formed of a magnetic material including but not limited to CoFeB, CoFeBTi, CoFeBZr, CoFeBHf, CoFeBV, CoFeBTa, CoFeBCr, CoFeNi, CoFeTi, CoFeZr, CoFeHf, CoFeV, CoFeNb, CoFeTa, CoFeCr, CoFeMo, CoFeW, CoFeAl, CoFeSi, CoFeGe, CoFeP, or any combinations thereof. For example, the free layer 230 may comprise a super lattice structure. For example, the free layer 230 may comprise repeated alternating layers of two or more materials.

According to one embodiment, the MTJ element 200 may further comprise a capping layer 240, such as MgO or $Al_2O_3$, interposed between the top electrode layer 322 and the free layer 230. According to one embodiment, the top electrode layer 322 may comprise a ruthenium (Ru) layer and/or a tantalum (Ta) layer. For example, the top electrode layer 322 may be composed of ruthenium (Ru) having a hexagonal close packed (hcp) crystalline structure. The top electrode layer 322 may act as an etching stopper, for example, during the etching process for patterning the MTJ element 200. According to one embodiment, the top electrode layer 322 may further comprise a titanium nitride (TiN) layer or a tantalum nitride (TaN) layer on top of the Ru layer. The MTJ element 200 is electrically connected to an overlying bit line 420 through the top electrode layer 322.

According to one embodiment, the MTJ element 200 has a tapered sidewall profile and is provided with a sidewall protection layer 250 covering the sloped sidewall including the sidewall surface of each layer or sub-layer of the MTJ element 200. According to one embodiment, the sidewall protection layer 250 may comprise silicon nitride or silicon oxide, but not limited thereto. Preferably, the sidewall protection layer 250 comprises silicon nitride to avoid the adverse effects of the oxygen atoms. The sidewall protection layer 250 protects the layers/sub-layers of the MTJ element 200 from leakage or short risk.

Figure 2:
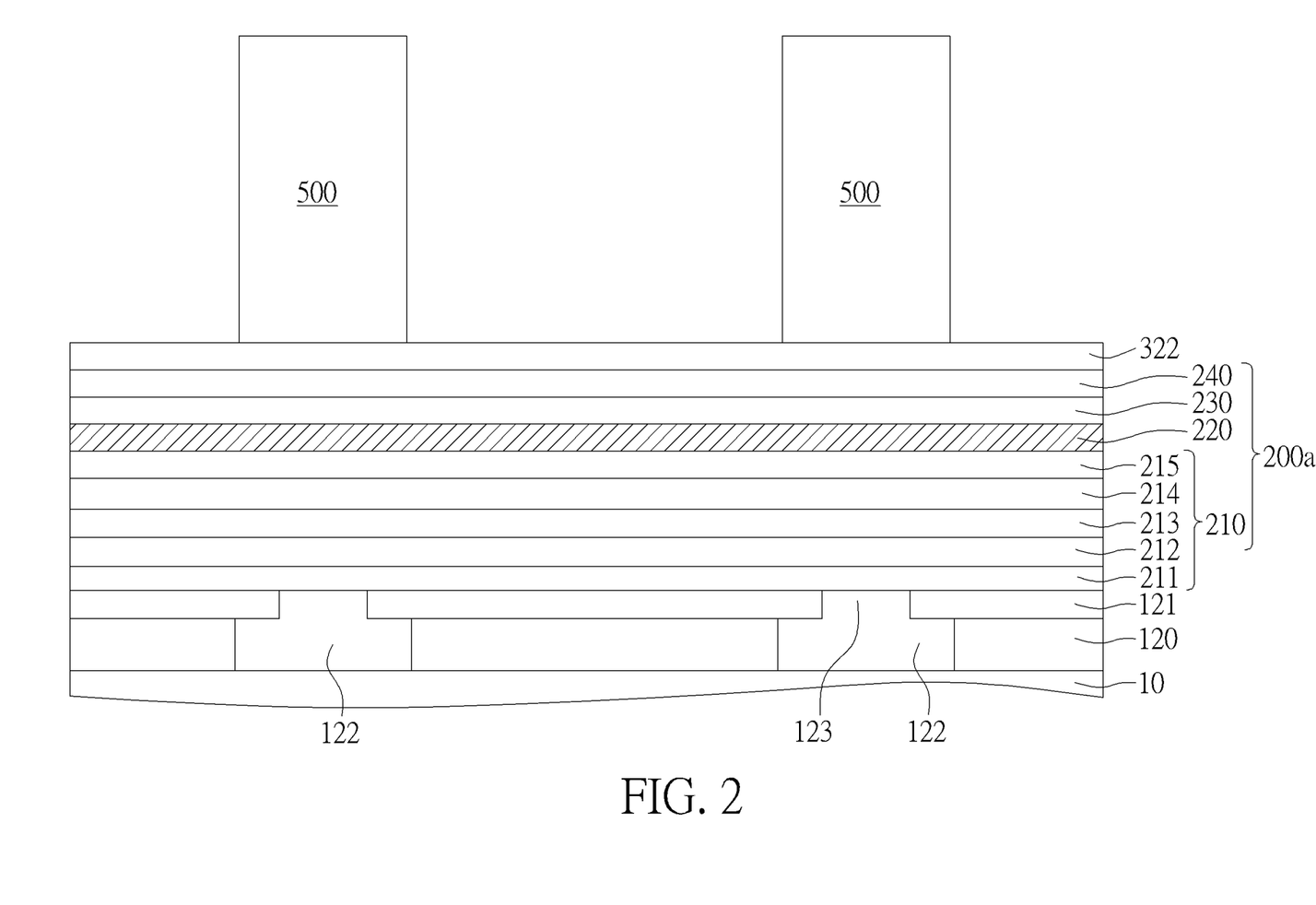
FIG. 2 to FIG. 5 are cross-sectional diagrams showing a method for fabricating a MTJ element of a magnetic memory device according to one embodiment of the present disclosure.

Please refer to FIG. 2 to FIG. 5. FIG. 2 to FIG. 5 are cross-sectional diagrams showing a method for fabricating a MTJ element of a magnetic memory device according to one embodiment of the present disclosure, wherein like elements, regions, or layers are designated by like numeral numbers. As shown in FIG. 2, a substrate 10 is provided. For example, the substrate 10 may be a silicon substrate, a SOI substrate, or any suitable semiconductor substrates known in the art. For the sake of simplicity, only the region for forming the MTJ element is shown in FIG. 2 to FIG. 5. It is understood that peripheral circuits for supporting the MRAM memory array may be formed on the substrate 10. The peripheral circuits may be formed in a logic circuit area, which is not shown in FIG. 2 to FIG. 5. The access transistor as depicted in FIG. 1 is also omitted through FIG. 2 to FIG. 5.

According to one embodiment, a bottom electrode layer 122 of a MTJ element or MTJ stack is formed in the ILD layer 120 on the substrate 10. The bottom electrode layer 122 may be electrically connected to a terminal of a transistor that is fabricated on the substrate 10 as depicted in FIG. 1. According to one embodiment, the bottom electrode layer 122 may comprise NiCr, Ru, Pt, Cu, Ta, TaN, Ti, TiN, or any combinations thereof, but not limited thereto. Another ILD layer 121 may be deposited on the bottom electrode layer 122 and the ILD layer 120. For example, the ILD layer 121 may comprise a silicon oxide layer, but not limited thereto. According to one embodiment, a via 123 may be formed in the ILD layer 121 on the bottom electrode layer 122. The via 123 is aligned and in direct contact with the bottom electrode layer 122. The via 123 may comprise NiCr, Ru, Pt, Cu, Ta, TaN, Ti, TiN, or any combinations thereof, but not limited thereto.

Subsequently, a plurality of thin films may be deposited on the ILD layer 121 and the via 123 to form a MTJ stack 200a. According to one embodiment, for example, the plurality of thin films may generally comprise the reference layer 210, the tunnel barrier layer 220 stacked directly on the reference layer 210, the free layer 230 stacked directly on the tunnel barrier layer 220, the capping layer 240 stacked directly on the free layer 230, and the top electrode layer 322 stacked directly on the capping layer 240. It is to be understood that the film stack through FIG. 2 to FIG. 5 are for illustration purposes only.

For example, the reference layer 210 may be formed by sequentially depositing sub-layers including, but not limited to, a bottom pinned layer 211, a ruthenium metal layer 212, a top pinned layer 213, a tantalum metal layer 214, and a magnetic material layer 215 such as CoFeB. According to some embodiments, each of the bottom pinned layer 211, the top pinned layer 213, and the free layer 230 may further comprise multiple sub-layers (not explicitly shown). For example, the tunnel barrier layer 220 may comprise MgO, $Al_2O_3$, MgAlO, MgZnO, HfO, or any combinations thereof. For example, the free layer 230 may comprise Fe, Co, B, Ni, or any combinations thereof. For example, the free layer 230 may be formed of a magnetic material including but not limited to CoFeB, CoFeBTi, CoFeBZr, CoFeBHf, CoFeBV, CoFeBTa, CoFeBCr, CoFeNi, CoFeTi, CoFeZr, CoFeHf, CoFeV, CoFeNb, CoFeTa, CoFeCr, CoFeMo, CoFeW, CoFeAl, CoFeSi, CoFeGe, CoFeP, or any combinations thereof. The capping layer 240 may be composed of MgO, $AlO_x$, $TiO_x$, $HfO_x$, $MgAlO_x$, $MgZnO_x$, $SiO_x$, $TaO_x$, $VO_x$, or any combinations thereof. For example, the top electrode layer 322 may comprise a Ru layer and/or a Ta layer. For example, the top electrode layer 322 may be composed of Ru having hcp crystalline structure.

According to one embodiment, a patterned sacrificial layer 500 is then formed on the top electrode layer 322. To form the patterned sacrificial layer 500, for example, a material layer such as $SiO_2$, $Si_3N_4$, TiN or TaN having a thickness of about 100-300 nm is deposited on the top electrode layer 322. Thereafter, the material layer is patterned by performing conventional photolithographic processes and etching processes to define the MTJ regions. For example, the material layer may be etched by F-based or Cl-based plasma. Preferably, the patterned sacrificial layer 500 is composed of conductive material such as TiN or TaN. The thickness of patterned sacrificial layer 500 is thicker than the total thickness of the MTJ stack that is comprised of at least the reference layer 210, the tunnel barrier layer 220, the free layer 230, the capping layer 240, and the top electrode layer 322.

Figure 3:
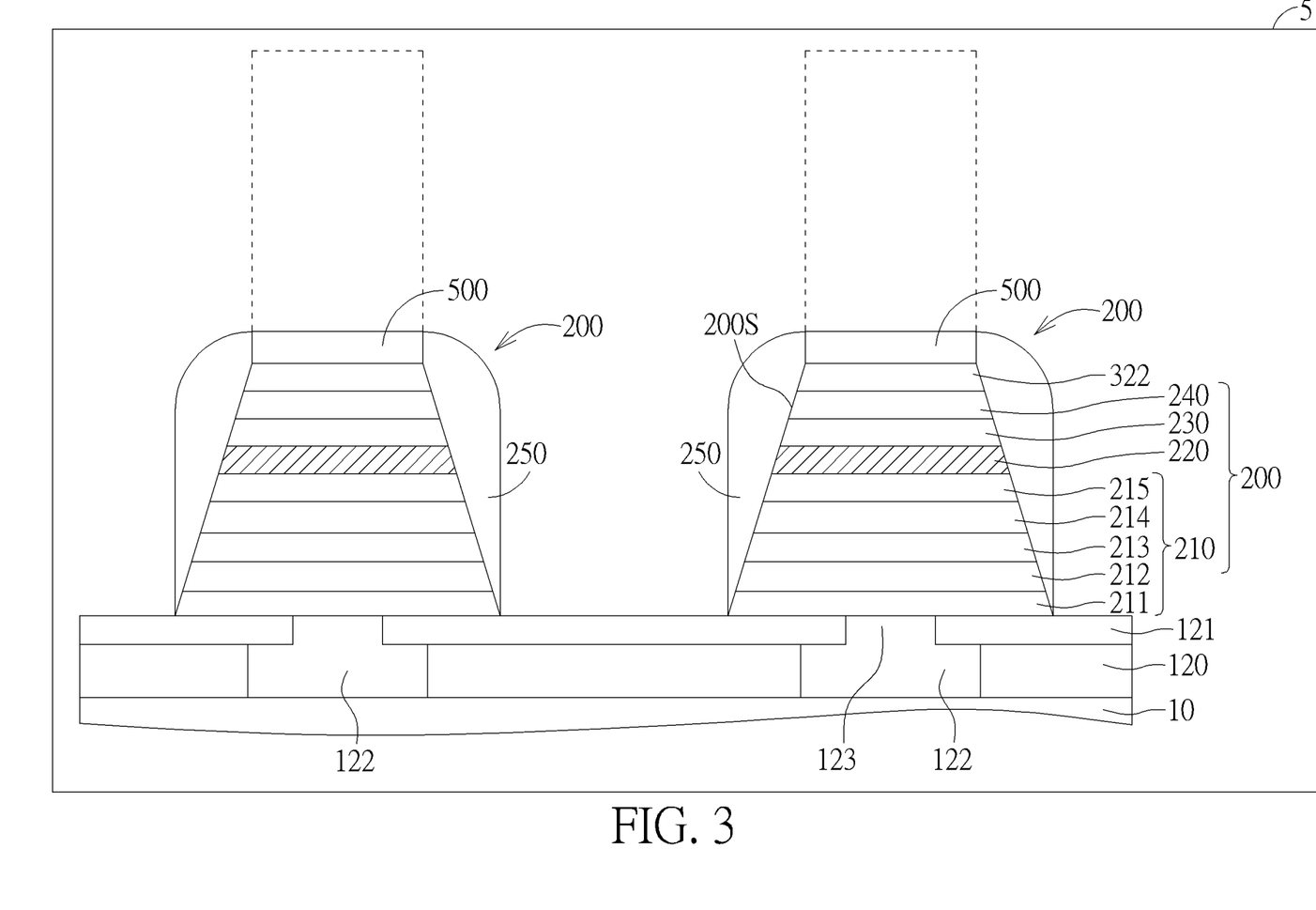

As shown in FIG. 3, the substrate 10 is then transferred to and disposed inside a HDPCVD chamber 5 for subsequent MTJ patterning process. As known in the art, HDPCVD processes are typically employed to deposit gap-fill material such as silicon oxide or silicon nitride on the wafers. It is to be understood that the HDPCVD tool may be a commercial CVD tool that integrates multiple reactor (vacuum) chambers and/or processing units such as cleaning units as in one single station. The wafers under gap-fill processing are typically transferred between chambers by robot arms or the like. For example, the reactor chambers may be equipped with radio-frequency (RF) sources, inductive coil powered by the RF sources, a gas delivery system, a vacuum system, a temperature-controlled electrostatic chuck, and the like. The HDPCVD tools are well-known in the art, and therefore the details of the HDPCVD tool are omitted for the sake of simplicity. In general, HDP deposition processes may be characterized by the ratio of deposition (D) to sputtering (S). Typically, a deposition to sputtering ratio (D/S ratio) of about 2-10 may be employed for gap-fill processing.

According to one embodiment, the MTJ stack 200a is subjected to a HDPCVD process with a D/S ratio ranging between about 0.1-0.5. For example, to simultaneously etch and passivate the sidewall surfaces of the layers or sub-layers in the MTJ stack 200a by depositing silicon nitride on the sidewall surfaces of the layers or sub-layers, gases such as Ar, $SiH_4$, and nitrogen source such as ammonia may be introduced into the HDPCVD chamber 5 during the MTJ patterning process. Under the aforesaid D/S ratio condition, the etch rate is faster than deposition rate. The MTJ stack 200a not covered by the patterned sacrificial layer 500 is etched (sputtered off) by Ar ion beam and the sidewall surfaces of the layers or sub-layers in the MTJ stack 200a are simultaneously and in-situ passivated in the HDPCVD chamber 5, thereby forming MTJ elements 200 on the vias 123, respectively. According to one embodiment, the resultant MTJ element 200 may have a sloped sidewall profile. The MTJ element 200 may taper off from the bottom pinned layer 211 to the top electrode layer 322. When etching the MTJ stack 200a, a sidewall protection layer 250 is concurrently deposited onto the sloped sidewall 200S of the MTJ element 200. Preferably, the sidewall protection layer 250 may be composed of silicon nitride, but not limited thereto. In some embodiments, the sidewall protection layer 250 may be composed of silicon oxide or any suitable materials. The patterned sacrificial layer 500 is consumed during the MTJ patterning process and a portion of the patterned sacrificial layer 500 may be remained on the top electrode layer 322. The original profile of the patterned sacrificial layer 500 is indicated by dotted line in FIG. 3.

It is advantageous to use the present invention because by protecting the sidewalls of each layer or sub-layers in the MTJ stack during the MTJ patterning process, the unwanted sputter residual substance may only be re-deposited onto the surface of the sidewall protection layer 250, and the potential short or leakage problems may be avoided. According to some embodiments, the remaining portion of the patterned sacrificial layer 500 such as TaN directly on the top electrode layer 322 may function as a barrier layer.

Figure 4:
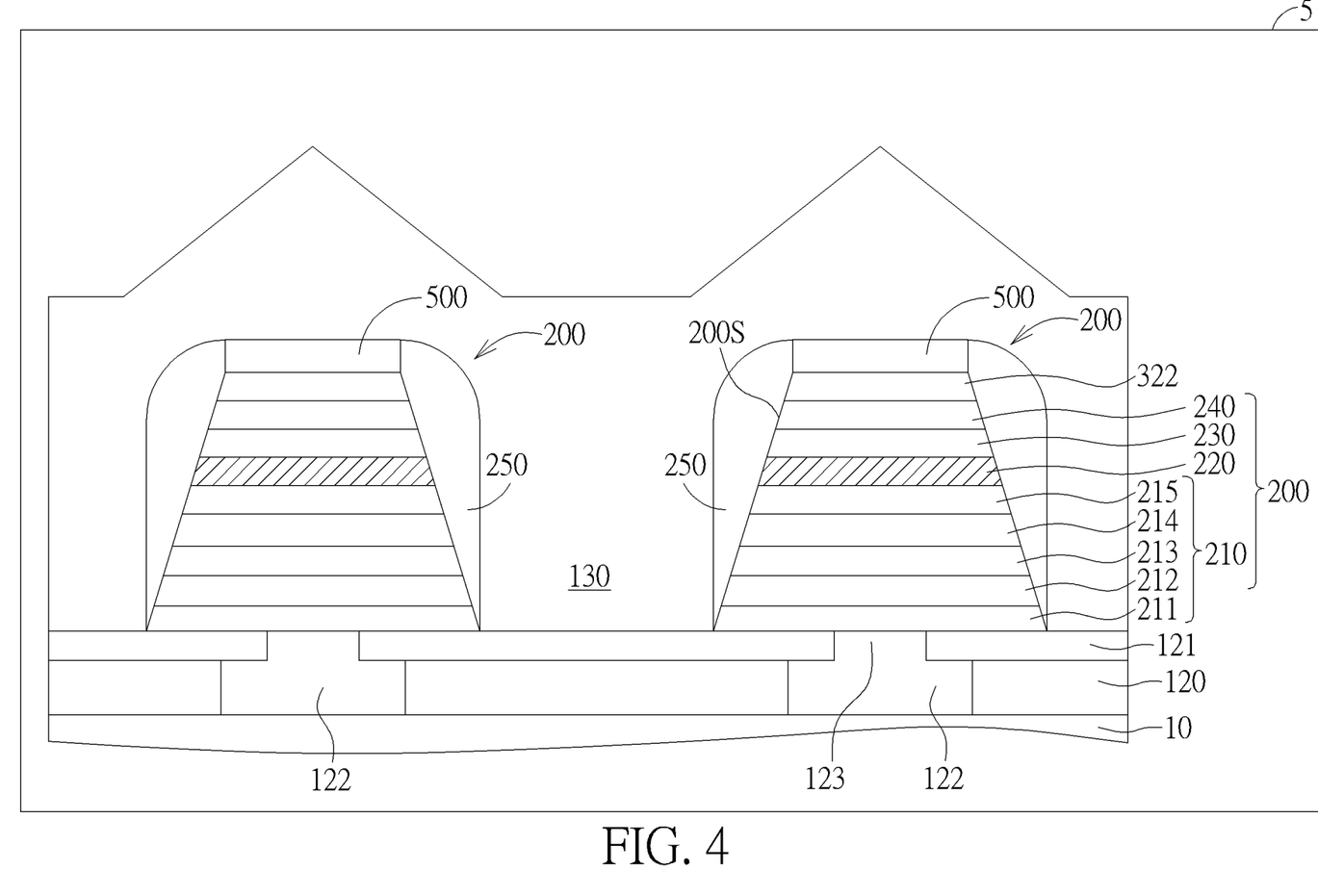

Subsequently, as shown in FIG. 4, after the formation of the MTJ element 200 and the sidewall protection layer 250 is completed, a gap-fill deposition process is carried out in the same HDPCVD chamber 5 to deposit the ILD layer 130 such as HDPCVD dielectric layer on the MTJ elements 200 and into the space between the MTJ elements 200. According to one embodiment, the aforesaid gap-fill deposition process may be carried out with a D/S ratio ranging between about 2 and 10, but not limited thereto.

Figure 5:
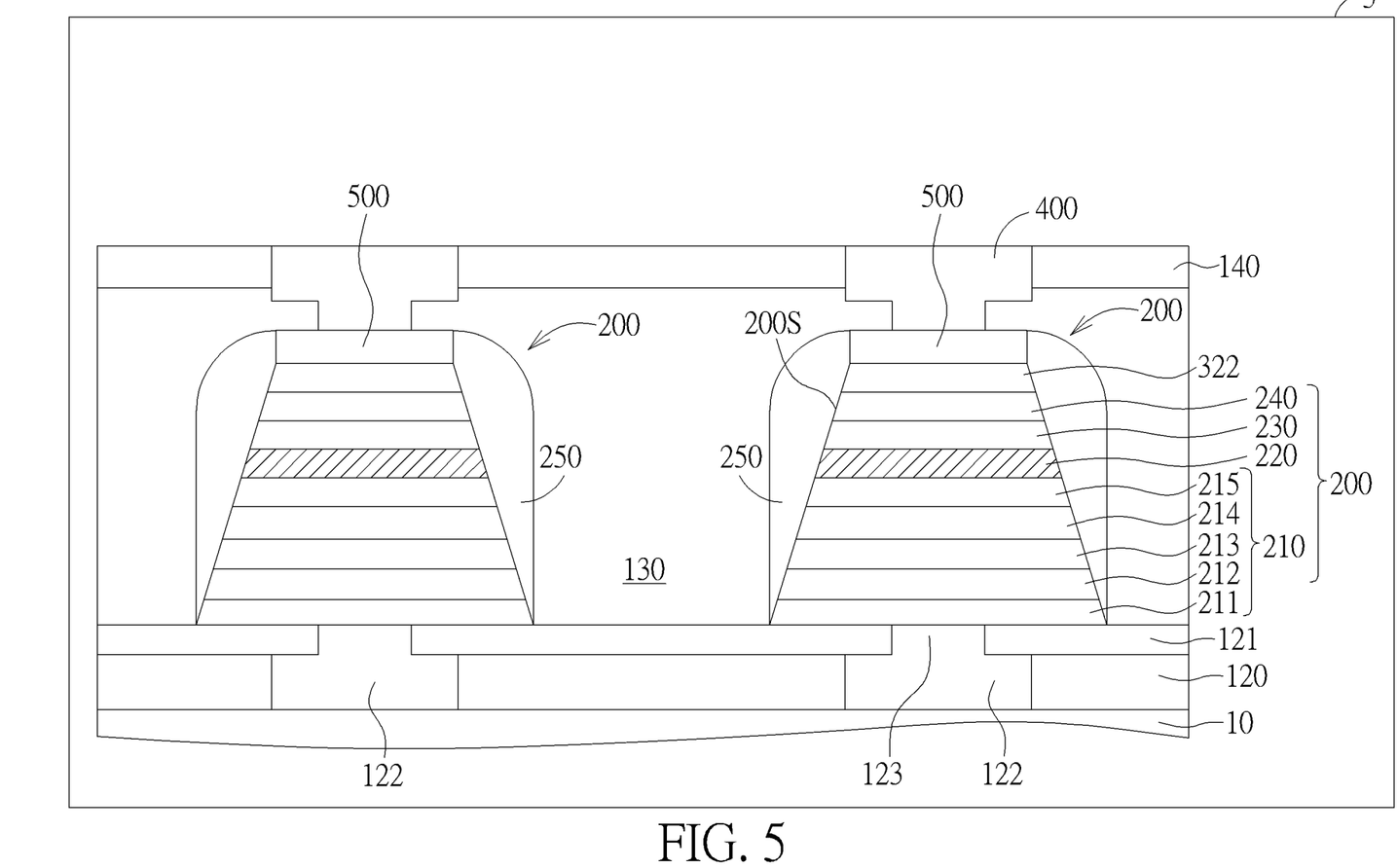

As shown in FIG. 5, a chemical mechanical polishing (CMP) process may be performed to planarize the ILD layer 130. According to one embodiment, after the CMP process, another ILD layer 140 may be deposited on the ILD layer 130. Thereafter, an interconnect structure 400 such as copper dual damascene structure may be formed in the ILD layers 130 and 140 to electrically connect the MTJ elements 200.

It is one technical feature of the present invention that the MTJ patterning process, the formation of the sidewall protection layers 250 and the formation of the ILD layers 130 and 140 that fill the gap between the MTJ elements 200 are sequentially carried out in the same HDPCVD chamber without breaking the vacuum of the HDPCVD chamber. The formation of the MTJ stack having sidewall protection can be done in one single HDPCVD tool. Therefore, the throughput can be increased and the cost of the fabrication process is reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a magnetic memory device, comprising:
   providing a substrate;
   forming at least a magnetic tunneling junction (MTJ) stack on said substrate, wherein said MTJ stack comprises a reference layer, a tunnel barrier layer, and a free layer;
   forming a top electrode layer on the MTJ stack;
   forming a patterned sacrificial layer on said top electrode layer;
   subjecting said MTJ stack to a MTJ patterning process in a high-density plasma chemical vapor deposition (HDPCVD) chamber, thereby sputtering off said MTJ stack not covered by said patterned sacrificial layer; and
   simultaneously passivating sidewalls of layers or sub-layers of said MTJ stack during said MTJ patterning process in said HDPCVD chamber by depositing a non-conformal sidewall protection layer, wherein a thickness of the non-conformal sidewall protection layer decreases from top to bottom.

2. The method according to claim 1, wherein said MTJ stack is etched in said high-density plasma chemical vapor deposition (HDPCVD) chamber with a deposition to sputtering ratio ranging between about 0.1-0.5.

3. The method according to claim 1, wherein said sidewall protection layer comprises silicon nitride.

4. The method according to claim 1, wherein said sidewall protection layer comprises silicon oxide.

5. The method according to claim 1 further comprising:
   depositing a HDPCVD dielectric layer covering said non-conformal sidewall protection layer in said HDPCVD chamber with a deposition to sputtering ratio ranging between about 2-10.

* * * * *